United States Patent [19]

Buchwalter et al.

[11] Patent Number: 5,187,241

[45] Date of Patent: Feb. 16, 1993

[54] ISOIMIDE MODIFICATIONS OF A POLYIMIDE AND REACTION THEREOF WITH NUCLEOPHILES

[75] Inventors: Stephen L. Buchwalter, Wappingers Falls, N.Y.; Ernest R. Frank, Madison, Wis.; Terrence R. O'Toole, Hopewell Junction, N.Y.; Richard R. Thomas, Fishkill, N.Y.; Alfred Viehbeck, Stormville, N.Y.

[73] Assignee: International Business Machines Corporation, Armonk, N.Y.

[21] Appl. No.: 770,506

[22] Filed: Oct. 3, 1991

Related U.S. Application Data

[63] Continuation-in-part of Ser. No. 523,764, May 15, 1990, Pat. No. 5,133,840.

[51] Int. Cl.$^5$ ............................................. C08L 77/06
[52] U.S. Cl. ..................................... 525/420; 525/436; 525/452
[58] Field of Search ..................... 525/420, 436, 452

[56] References Cited

U.S. PATENT DOCUMENTS

| | | | |
|---|---|---|---|
| 3,361,589 | 1/1968 | Lindsey | 117/118 |
| 3,445,264 | 5/1969 | Haines | 252/182 X |
| 3,881,049 | 4/1975 | Brandt et al. | 428/458 |
| 3,953,877 | 4/1976 | Sigusch et al. | 357/72 |
| 4,430,153 | 2/1984 | Gleason et al. | 156/643 |
| 4,517,254 | 5/1985 | Grapentin et al. | 428/626 |
| 4,551,522 | 11/1985 | Fryd et al. | 528/351 |
| 4,582,245 | 7/1985 | Jobbins | 428/457 |
| 4,722,992 | 2/1988 | Hanson | 528/172 |
| 4,803,097 | 2/1989 | Fraenkel et al. | 427/307 |
| 4,824,699 | 4/1989 | Woo et al. | 427/307 |
| 4,861,663 | 8/1989 | Sirinyan et al. | 428/409 |
| 4,873,136 | 10/1989 | Foust et al. | 428/209 |
| 4,931,310 | 6/1990 | Anschel et al. | 427/55 |

OTHER PUBLICATIONS

Ernst et al., "Isoimides. A Kinetic Study of the Reactions of Nucleophiles with N-Phenylphtalisoimide", *Journal of the American Society*, 88:21, 1966, pp. 5001-5009.

Angelo et al., "Cyclization Studies of Amic Acids to Imides and Isoimides: Monomeric and Polymeric Reactions", *Recent Advances in Polyimide Science & Technology*, 1987, pp. 67-89.

Primary Examiner—Maurice J. Welsh
Attorney, Agent, or Firm—Scully, Scott, Murphy & Presser

[57] ABSTRACT

The invention relates to the formation of isoimides from amic acids, especially polyisoimides by a novel process in which polyimides are first converted to polyamic acids and then contacted with an isoimidizing agent. An acyl halide of a heterocyclic nitrogen compound or an acyl halide of a heterocyclic sulphur compound can be used as the isoimidizing agent. The isoimidization may also be carried out in the presence of a compound containing a heterocyclic nitrogen especially a solvent containing a heterocyclic nitrogen.

The invention is especially applicable to conducting nucleophilic addition reactions on the surface of polyimides where the surface has been converted to a polyamic acid or on the surface of polyamic acid materials followed by isoimidization and reaction of the isoimide with a nucleophile such as an amine or organic hydroxy compound.

Photosensitive metal compounds or electroless metal coating catalysts can be coordinated with the compositions obtained.

61 Claims, No Drawings

ISOIMIDE MODIFICATIONS OF A POLYIMIDE AND REACTION THEREOF WITH NUCLEOPHILES

This application is a continuation-in-part of U.S. patent application Ser. No. 523,764 filed May 15, 1990 and now U.S. Pat. No. 5,133,840.

TECHNICAL FIELD

The technical field to which the invention relates is the formation of isoimides from amic acids, and more particularly, the isoimide modification of a polyimide followed by reacting the isoimide obtained with a nucleophile.

The invention relates to the formation of isoimides from amic acids, especially polyisoimides by a novel process in which the polyimides are first converted to polyamic acids and then contacted with an isoimidizing agent such as, for example an acyl halide of a heterocyclic nitrogen compound or an acyl halide of a heterocyclic sulphur compound or other isoimidizing agents known in the art. The isoimidization is also carried out in the presence of a compound containing a heterocyclic nitrogen group especially a solvent containing a heterocyclic nitrogen group.

The invention is especially applicable to conducting organic reactions on the surface of polyimides where the surface has been converted to a polyamic acid or on the surface of polyamic acid materials.

PRIOR ART

Isoimides were first prepared by Hoogewerff et al. *Rec. Trav. Chim.*, Vol. 12, 12 (1893); ibid., 13, 93 (1894); ibid., Vol. 14, 252 (1895). The reaction of isoimides with amines to yield ring-opened adducts is also known, P. H. Vander Meulen, *Rec. Trav. Chim.*, Vol. 15, 345 (1896), whereas the ring-opening polyaddition of N,N'-disubstituted bisisomaleimide with diamines as a route to polymaleamides has been reported. Imai, et al. *J. Poly. Sci. Polym. Chem Ed.*, Vol. 13 (7) 1691 (1975). A kinetic study of the reactions of nucleophiles with N-phenyl-phthalisoimide has also been reported by Ernst et al., J. A.C.S., Vol. 88:21, 5001 (1966) whereas Angelo et al. has reported various cyclization studies of amic acids to imides and isoimides for both monomeric and polymeric compounds. *Recent Advances in Polyimide Science & Technology*, Mid-hudson Chapter of Society of Plastic Engineers, Poughkeepsie, N.Y., pp. 67–89 (1987).

Lindsey, U.S. Pat. No. 3,361,589 describes treating the surface of a polyimide with a caustic material, neutralizing the treated surface with an acid and bonding the treated surfaces to one another directly or with an epoxy/maleic acid anhydride or epoxy/pyromellitic acid dianhydride adhesive.

Gleason, et al. U.S. Pat. No. 4,430,153 describes a process for partially imidizing a polyamic acid, reacting any residual surface polyamic acid groups with an amino silane and converting the reacted surface with an oxygen plasma to form an etch resist.

Foust el al. U.S. Pat. No. 4,873,136 describes a method for preparing a polyimide surface so that it will have improved adhesion to a catalyst such as palladium which is employed in the formation of electroless metal coatings. The surface of the polyimide is mildly etched with a basic solution, contacted with a cationic surfactant followed by treatment with an adhesion promoter such as a hydroxylamine, oxime, triazoles, biurets, semi-carbazides after which a palladium metal catalyst is provided to the surface.

CROSS REFERENCE TO A RELATED APPLICATION

In copending U.S. patent applications Buchwalter et al. Ser. No. 523,764 filed May 15, 1990 and now U.S. Pat. No. 5,133,840, a process is disclosed for hydrolyzing a surface of a polyimide polymer to form polyamic acid on the surface. In this process the surface of the polyimide is contacted with a caustic material such as dilute solutions of an alkali metal hydroxide, an alkaline earth hydroxide, ammonium hydroxide or a tetra- alkylammonium hydroxide solution or any of the organic bases, followed by neutralizing the surface with an aqueous inorganic or organic acid solution.

This process, which is conducted at mild conditions e.g. 0.25M sodium hydroxide at room temperature ensures that the hydrolysis is substantially confined to the surface and does not degrade the desirable dielectric bulk properties of the polyimide. The amic acid groups thus obtained can be re-imidized at a later time, if desired, by heating the sample to above about 150° C. Once the amic acid carboxyl groups are obtained, they are subsequently used as reactive sites for a wide variety of reactions for specific applications such as esterification with hydroxy-functional compounds.

As noted in Buchwalter et al., organic reactions in solution are not easily extended to these amic acid polymer surfaces for a number of reasons. The amount of reactive groups on a polymer surface is many times smaller than even the most dilute solution of a compound containing similar groups. The difference in amount places stringent requirements on purity of the reagents because the most minor impurity, if sufficiently reactive, can preferentially react with the surface groups to give an undesired reaction. Reactions also must be chosen to give quantitative conversions of the surface groups to avoid complications of competitive reactions. The reactions should not cause by-products to be precipitated on the surface, contaminating it for further reactions or preventing the desired surface property from being obtained. Reaction conditions must be mild enough to avoid reorganization of the surface, i.e. incorporation of the surface groups in the bulk polymer, exposing unmodified polymer at the surface, or degradation of the molecular weight or polymer chain bonds. Temperature excursions or exposure of the surface to plasticizing solvents can cause surface reorganization. These considerations taken together imply that no solution reaction can be expected to work in the polymer surface without due care and thorough experimentation.

In the Buchwalter et al. invention it was found that in the case of reacting alcohols with the surface carboxyl groups formed on the polyimides, that the reaction proceeds by first ionizing the carboxyl group with an amine such as triethylamine followed by the reaction of the alcohol in combination with an alkyl chloroformate such as ethyl chloroformate. Direct esterification of the carboxyl groups was not as efficient in the reaction because water formed as a by-product of the reaction interfered with the reaction. This is especially a problem where the esterification is conducted on the surface of a polymer containing carboxyl groups for the reasons previously stated viz. the relatively smaller amount of reactive groups on the polymer surface as compared to even a highly dilute solution of the material containing similar reactive groups.

Since polyimide materials are widely used as insulators in the manufacture of printed circuits or for printed circuit boards there have been many attempts to improve the adhesion of electroless metal catalysts to the polyimide where the polymer is a substrate on which conductive metal coatings are applied, especially patterned conductive metal coatings or printed circuits. This is the case since polyimide substrates are not easily provided with a strongly adherent metal coating as noted by Foust et al.(supra). One of the prior art methods for improving adhesion comprised abrading the surface mechanically or by the use of chemical agents or penetrants to swell the polymer surface.

SUMMARY OF THE INVENTION

The present invention is directed to a process for improving the reactivity of a polyamic acid with a nucleophile by reacting the polyamic acid with an isoimidizing agent to form a polyisoimide and then reacting the polyisoimide with the nucleophile. In one embodiment, polyamic acid is obtained by hydrolyzing a polyimide to the polyamic acid. The various nucleophiles that can be reacted with the polyisoimide obtained comprise organic hydroxy compounds or organic amines.

In another embodiment, an amic acid or a polyamic acid such as a polyamic acid obtained by the hydrolysis of the surface of a polyimide is isoimidized with an acylhalide of a heterocyclic nitrogen compound or an acyl halide of a heterocyclic sulphur compound. This isoimidization reaction may be carried out in the presence of a heterocyclic nitrogen compound which can act as a solvent for the reactants. The isoimides, including the polyisoimides obtained are also reacted with nucleophiles such as organic hydroxy compounds or organic amines and can be further reacted with electroless metal coating catalysts or photosensitive compounds in order to form a photosensitive material such as a photosensitive polyimide or a photosensitive layer on a polyimide.

DETAILED DESCRIPTION

The polyimides are known in the art and are produced by the reaction of dianhydrides with diamines. Polymerization processes can be divided into condensation and addition polymerizations, sometimes referred to respectively as step-reaction and chain-reaction polymerization. Condensation or step-reaction polymerization takes place between two polyfunctional molecules to produce a larger molecule usually (but not always) with the production of water or a similar low molecular weight molecule until an equilibrium is established which can be changed by reaction temperatures and the addition of reactants and withdrawal of polymer product. The formation of polyimides proceeds by a condensation or a step-reaction between dianhydrides and diamines to form polyamic acids which are then thermally or chemically cylicized to the polyimide which is insoluble in most solvents. Polyimides may also be formed by the substitution of the dianhydrides with either a diester-diacid or a diester-diacid dichloride or by the reaction of the dianhydride with a diisocyanate, the reaction of the bis(methyl-olimide)s with a diisocyanate or the electrochemical condehsation of aminophthalic acid as well as the reaction of bis(carboethoxy) diimide with a diamine.

The various art known polyimides are further described in Kirk-Othmer *Encyclopedia of Chemical Technology*, Third Edition, Vol. 18 pp. 704–719 (including the references cited therein) as well as Dunphy et al. U.S. Pat. No. 3,770,573 (and the references cited therein) and Lindsey, U.S. Pat. No. 3,361,589 (and the references cited therein) all of which are incorporated herein by reference.

The ability to tailor the surface properties of polyimide films is of great importance in the electronic packaging art. By altering the surface, one can improve the interfacial adhesion of the polyimide to another polymer or metal layer or allow for the incorporation of catalysts for electroless metallization.

Base hydrolysis of the surface of a polyimide to produce carboxyl groups on the surface is known in the art. This has proven useful for polyimide/polyimide adhesion e.g. by a trans-imidization reaction or by epoxy organic acid anhydride adhesives, and has also been employed as an ion-exchange medium to incorporate metal salts. In many instances, however, it is desirable to incorporate a functional group in the polyimide other than the polyamic acid carboxyl group. One of the properties of polyimides, however, is their resistance to chemical attack and in most instances direct incorporation of other functional groups is not readily achieved. In the foregoing Buchwalter U.S. patent application, methods are disclosed not only for the hydrolysis of polyimide surfaces but also methods and compositions for reaction of these carboxyl groups to provide other functional groups on the surface. Although the carboxyl groups will enter into a reaction with nucleophiles (a reagent which brings an electron pair to the reaction) the direct reaction of such carboxyl groups with an organic hydroxy compound such as an aliphatic alcohol or an organic amine such as an aliphatic amine proceeds by a reaction that is sometimes referred to as nucleophilic substitution, i.e., reaction by-products are also produced such as is the case in the esterification of a carboxylic acid with an alcohol wherein both an ester and water are produced. As noted before, this can be problematic in polyamic acid reactions with organic hydroxy compounds conducted on a polymer surface.

Accordingly, it is an object of the present invention to overcome these and other difficulties encountered in the prior art.

It is also an object of the present invention to provide a route to modify a polyimide using nucleophiles that ordinarily would not readily react with a polyimide.

It is also an object of the present invention to provide a process for improving the reactivity of a polyamic acid with a nucleophile especially where the polyamic acid is obtained by hydrolyzing the surface of the polyimide.

It is a further object of the present invention to provide a novel process and composition for isoimidizing an amic acid, especially where such amic acid is a polyamic acid and especially a polyamic acid obtained by the hydrolysis of the surface of a polyimide.

It is a further object of the present invention to provide novel products from isoimides especially those produced according to the process of the invention where such isoimides are reacted with nucleophiles such as organic hydroxy compounds or organic amines which are useful per se or can be further reacted to provide materials useful for electroless coating processes, copolymerization processes or photographic purposes.

These and other objects have been achieved according to the present invention as set forth in the written description and claims that follow.

As noted previously in Buchwalter, et al., the reaction of compounds having active hydrogens such as organic hydroxy compounds or organic amines with polyamic acids, and especially polyamic acids formed by the surface hydrolysis of polyimides, generally proceeds by conventional condensation mechanisms, i.e., a nucleophilic substitution reaction.

The reaction of a carboxyl group with an organic hydroxy compound to produce an ester and water is a typical nucleophilic substitution reaction. For the purpose of the present invention, a reagent which brings an electron pair to a reaction is called a nucleophile and the reaction is called nucleophilic. The reagent will react with a substrate which is that molecule in the reaction which supplies carbon to the new bond that is formed by the reaction.

Nucleophilic reactions can also proceed by an addition mechanism to double or triple bonds by which there is no by-product produced from the reaction of the reagent with the substrate. These reactions fall into two categories designated as nucleophilic addition and simultaneous addition. This is the terminology also employed by March, *Advanced Organic Chemistry*, Second Edition pp. 187-90. The synthesis of polyamic acids from dianhydrides and diamines is one example of a nucleophic addition reaction.

For the purposes of the present invention the nucleophilic addition employing the nucleophiles are intended to included both types of addition reactions to double or triple bonds and will be referred to as nucleophilic additions.

The resistance of polyimides to nucleophilic addition or substitution reactions is known in the art and accounts in part for its stability and good electrical and mechanical properties. Chemical modification of the polyimide, especially the surface of a polyimide can now be effected by employing the process of the present invention and the products obtained by this process by which a polyimide is modified, and especially the surface of a polyimide is modified to contain a chemical group having a double bond followed by reacting this chemical group with a nucleophile that will combine with this chemical group by nucleophilic addition.

In one embodiment, this is achieved by converting the polyimide into a polyisoimide. The polyisoimide is formed by hydrolyzing the polyimide to a polyamic acid and then contacting the polyamic acid thus obtained with an isoimidizing agent sometimes described in the art as a dehydrating agent e.g. trifluoroacetic anhydride. The polyisoimide produced comprises a substrate more reactive to nucleophilic addition reactions than the parent polyimide or polyamic acid. This reaction results in the formation of chemical group linking the nucleophile to the substrate.

In another aspect of the invention, a process is provided for isoimidizing an amic acid by contacting an amic acid compound and especially a polyamic acid compound and more particularly a polyimide surface that has been hydrolyzed to contain polyamic acid groups with an imidizing agent comprising an acyl halide of a heterocyclic nitrogen compound or an acyl halide of a heterocyclic sulphur compound in order to obtain an isoimide based on the amic acid starting compound.

The isoimide obtained in either process is then contacted with a nucleophile such as an organic amine or an organic hydroxy compound. The organic amines that might be employed in this regard comprise an aliphatic or cyclic monoamine or an aliphatic or cyclic polyamine. The nucleophiles also comprise organic hydroxy compounds especially aliphatic or cyclic monohydroxy compounds or aliphatic or cyclic polyhydroxy compounds such as dihydroxy compounds. Again, the "cyclic" amines or hydroxy compounds include those where this cyclic moiety is saturated or unsaturated e.g. aromatic.

In the process of the present invention the various polyimides that may be reacted according to the invention and which are described and defined previously herein are subjected to hydrolysis, especially base hydrolysis as described by Buchwalter, et al. in order to produce a polyimide having a surface containing carboxylate groups. Subsequent reaction with a mineral acid or an organic acid will convert the carboxylate group into carboxylic acid functionalities, again in a manner known in the art.

The process of the invention is also applicable to amic acid functionalities that are not prepared by the base hydrolysis of a polyimide, especially those polyamic acid compositions that are precursors to polyimides the latter being obtained by a dehydration reaction in which the amic acid functionality is imidized also in a manner well known in the art.

One aspect of the first embodiment of the invention, however, comprises converting the surface of a polyimide polymer to one containing polyamic acid functionalities followed by isoimidization. In this preferred embodiment, the excellent properties of the polyimide are obtained beneath the surface layer containing the amic acid functionalities and the excellent mechanical and electrical properties of the underlying polyimide are unaffected. This is especially important in the use of polyimide layers in electronic packaging applications where a relatively thin layer or plurality of layers of polyimide are employed in multilevel packages. The polyimide layers or films in this respect are anywhere from about 1 to about 25 $\mu$m in thickness and it is especially advantageous to avoid any modification of the polyimide under the surface containing the amic acid functionalities because of this relatively minute amount of polyimide in the electrical packaging composite that is required to contribute to the mechanical and electrical integrity of the package. For this reason, in one preferred embodiment, the amic acid functional groups are generated to a depth up to about 100 to about 5,000 Å (1 $\mu$m = 10,000 Å).

The amic acid functional groups are then converted to isoimide functionalities by contacting the amic acid groups with an imidizing agent, the isoimide functionality also extending downward from the surface of the polymer to approximately the same extent as the amic acid functionalities.

The various isoimidizing agents that may be employed in the aspect of the present invention comprise aliphatic or cyclic acid halides whether saturated or unsaturated, including branched chain aliphatic, and aliphatic substituted cyclic acid halides, such as an acetyl halide or benzoyl halide where the halogen is especially fluorine or chlorine. Additionally, aliphatic acid anhydrides having up to about 10 carbon atoms may also be employed such as acetic anhydride as well as halogenated aliphatic acid anhydrides especially trifluoroacetic anhydride, alkyl haloformates such as ethyl chloroformate especially in combination with a lower molecular weight amine such as a triloweralkyl amine, N-N'-dicyclohexylcarbodiimide (hereafter "DCC") and the like.

The polyimides that are of special interest for use according to the present invention comprise those based on cyclic tetracarboxyic acids or anhydrides where the cyclic moiety is either saturated or unsaturated, e.g. aromatic such as pyromellitic dianhydride (hereafter "PMDA") condensed with a cyclic diamine the cyclic moiety being previously defined, e.g. oxydianiline (hereafter "ODA"). Those based on the condensation of bis(phenylene dicarboxylic acid) anhydride (hereafter "BPDA") and p-phenylenediamine (hereafter "PDA") and the various art know equivalents thereof whi . . described in Kirk-Othmer, supra Dunphy et al., U.S. Pat. No. 3,770,573 as well as Lindsey, U.S. Pat. No. 3,361,589 can also be used. In addition, these polyimides may also comprise photosensitive polyimides (referred to hereafter as "PSPI") such as for example Ciba Geigy 412 and the various art known equivalents thereof as well as those described by Goff, U.S. Pat. No. 4,416,973; Fyrd et al. U.S. Pat. No. 4,551,522 and Higuchi et al. Chem. Mater. 1991, 3, 188-94. Other polyimides are also included such as those described by Araps, et al. U.S. Pat. No. 4,871,619, columns 3-6 (THERMID, trademark polyimides) and Roark et al. U.S. Pat. No. 4,859,530, a fluorinated polyimide, both useful in adhesive applications. All of the foregoing references are incorporated herein by reference along with the references cited therein.

Various amines may be used as co-catalysts for the isoimidization reaction such as aliphatic amines having up to about 6 carbon atoms including the straight chain or branched chain aliphatic amines, heterocyclic nitrogen compounds such as pyridine, pyrazine, (and its position isomers) and the like.

In that aspect of the invention dealing with the isoimidization of amic acids with the acylhalides of a heterocyclic nitrogen compound or acylhalides of a heterocyclic sulphur compound especially for the isoimidization of amic acid groups formed on the surface of a polyimide, it has been found that compounds such as nicotinyl chloride hydrochloride or 2-thiophenecarbonyl chloride are especially effective. Other imidizing agents such as acetyl chloride and benzoylchloride did not give as efficient results in that less isoimide and more imide was formed.

Nicotinyl chloride hydrochloride is an especially preferred isoimidizing agent as well as the various equivalents thereof which include those compounds having the following formula:

[Het-N]-CO-Hal where Het-N is a heterocyclic nitrogen radical and Hal is a halogen and especially chlorine or fluorine. The heterocyclic nitrogen radicals Het-N may be:

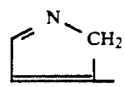

2H-Pyrrolyl

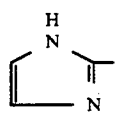

Imidazolyl

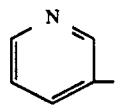

Pyridyl

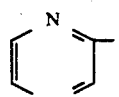

Pyrazinyl

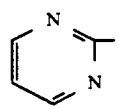

Pyrimidinyl

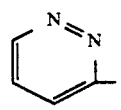

Pyridazinyl

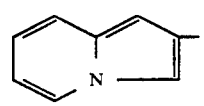

Indolizinyl

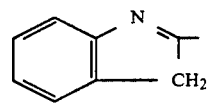

3H-Indolyl

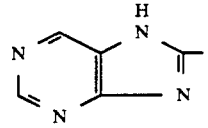

Purinyl

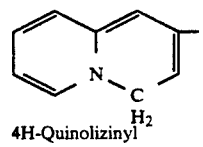

4H-Quinolizinyl

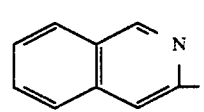

Isoquinolyl

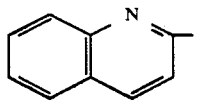

Quinolyl

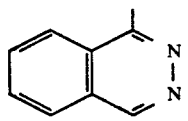

Phthalazinyl

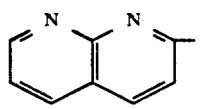

Naphthyridinyl

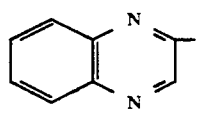

Quinoxalinyl

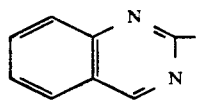

Quinazolinyl

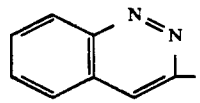

Cinnolinyl

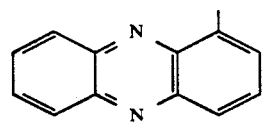

Phenazinyl

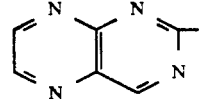

Pteridinyl

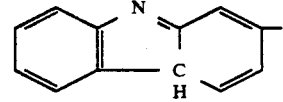

4aH-Carbazolyl

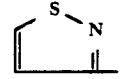

Isothiazolyl

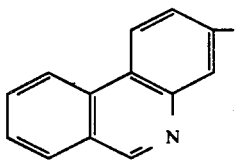

Phenanthridinyl

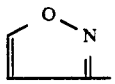

Isoxazolyl

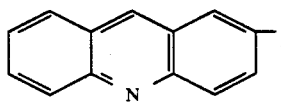

Acridinyl

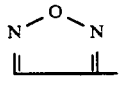

Furazanyl

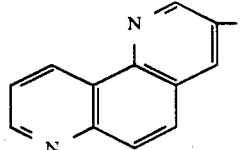

Phenanthrolinyl

As can be seen from the above, the heterocyclic nitrogen radical may contain other hetero atoms, but for the purpose of the present invention, these radicals will also be considered as heterocyclic nitrogen radicals.

The isoimidizing agent comprising the acyl halide of a heterocyclic sulphur compound, more broadly comprises those acyl halides of a heterocyclic chalcogen compound where the chalcogen is either oxygen, sulphur, selenium or telurium and especially sulphur and/or oxygen. These acyl halides will have the following formula:

[Het-Chal]-CO-Hal where Hal is halogen and especially chlorine or fluorine and Het-Chal is a heterocyclic chalcogen radical as follows:

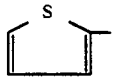

Thienyl

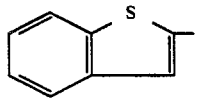

Benzo[b]thienyl

-continued

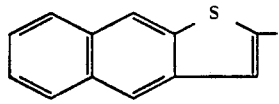

Naphtho[2,3-b]thienyl

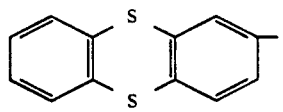

Thianthrenyl

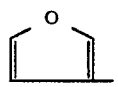

Furyl

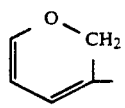

Pyranyl

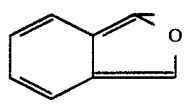

Isobenzofuranyl

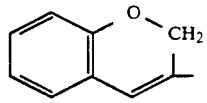

Chromenyl

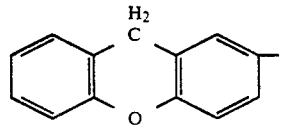

Xanthenyl

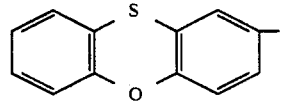

Phenoxathiinyl

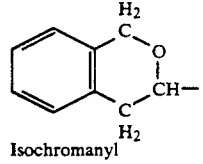

Isochromanyl

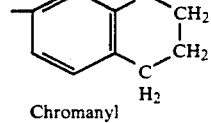

Chromanyl

These isoimidizing agents may be further described as those saturated or unsaturated compounds having the formula:

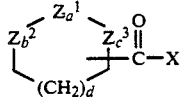

where
$Z^1$ = N, O, S, CH$_2$;
$Z^2$ = N, O, S, CH$_2$;
$Z^3$ = N;
X = halogen
where
a = 0 or 1;
b = 0 or 1;
c = 0 or 1;
d = 0 or 1;
so that a+b+c+d is at least 3
and $Z^1$, $Z^2$, $Z^3$ can be positioned as shown or substituted in any one of the positions in the ring,
and $Z^1$, $Z^2$, $Z^3$ can optionally be at least one fused heterocyclic ring or fused carbocyclic ring.

It has also been found according to the present invention that when the acylhalide of the heterocyclic nitrogen compound or the acyl halide of the heterocyclic sulphur compound are used as isoimidizing agents, that pyridine or comparable amines may be employed such as those having the heterocyclic nitrogen radicals previously defined herein wherein such heterocyclic nitrogen radicals are substituted with hydrogen but especially those heterocyclic nitrogen radicals which have a heterocyclic nitrogen atom with three ring bonds.

Preferred heterocyclic nitrogen compounds that may be employed in this respect comprise those having the formula:

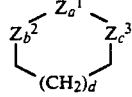

where
$Z^1$ = N, O, S, CH$_2$;
$Z^2$ = N, O, S, CH$_2$;
$Z^3$ = N;
where
a = 0 or 1;
b = 0 or 1;
c = 0 or 1;
d = 0 or 1;
so that a+b+c+d is at least 3 and $Z^1$, $Z^2$, $Z^3$ can be positioned as shown or substituted in any one of the positions in the ring;
and $Z^1$, $Z^2$, $Z^3$ can optionally be at least one fused heterocyclic ring or fused carbocyclic ring.

After the isomide is formed, it may be reacted with an organic hydroxy compound or an organic amine as noted herein, the organic hydroxy compounds also being described in Buchwalter et al. which is incorporated herein by reference. In addition to those amines and organic hydroxy compounds, other amines and organic hydroxy compounds can be utilized and comprise those having the formula:

(Het-N)-R$_a$—NH$_2$

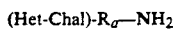

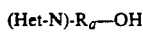

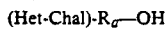

where (Het-N) and (Het-Chal), "a" are defined herein and R is a saturated or unsaturated carbocyclic group having up to about 10 and especially up to about 6 carbon atoms or a lower aliphatic group having up to about 4 carbon atoms as well as isomers thereof.

It has been found that when the isoimide produced according to the invention is reacted with either the forgoing heterocyclic nitrogen containing compounds, (whether an amine or hydroxy compound) or the aforesaid heterocyclic chalcogen compounds (again whether an amine or an organic hydroxy compound) the resulting amides or esters are suitable for coordinating a metal salt such as a Group VIII metal salt and especially a Group VIII noble metal salt to form a metal coordination compound with the heterocyclic nitrogen or heterocyclic chalcogen moieties that have been incorporated into the polymer through the polyisoimide groups. These coordination compounds may in turn be reduced to zero valent metal sites by reducing them chemically or electrolytically in a manner well known in the art. Where either the heterocyclic nitrogen or heterocyclic chalcogen compounds are applied to the polyisoimide in a pattern such as by application through a mask or by printing or tracing or where the metal is similarly applied in a pattern and coordinated with the heterocyclic nitrogen or heterocyclic chalcogen compounds reacted with the polyisoimide, a metal coating or pattern, whether a printed circuit metal or pattern or a decorative metal pattern, as the case may be, may be obtained after reduction.

Further in this regard chemical reducing agents utilized in the printed circuit board art may be employed such as the borohydrides, dimethylamineborane and the various art known equivalents thereof.

Where the metal salt comprises a precursor salt for an electroless metal coating such as a palladium salt and the art known equivalents thereof, once the salt is converted to a zero valent metal, an electroless metal coating typically containing an aldehyde reducing agent such as an electroless copper coating based on copper sulphate in combination with fomaldehyde may be applied to the zero valent metal catalyst which in turn will activate the aldehyde reducing agent so that the copper sulphate will be reduced to copper metal. Other electroless metal coatings such as nickel, zinc, tin and the like may also be employed or various combinations thereof to form alloy coatings. The electroless coatings may be subsequently coated electrolytically in a manner well known in the art.

The following examples are illustrative.

EXAMPLE 1

A thin film of cured BPDA-PDA (about 600 Å on $CaF_2$) was hydrolyzed in 1M KOH at 55° C. for 1 h. The film was re-protonated by soaking in 0.1 m HCl which forms polyamic acid. This polyamic acid was immersed in a solution of 2% nicotinyl chloride hydrochloride in pyridine at room temperature. Within 5 minutes the clear polymer became a bright yellow due to a new visible absorption band centered at 400 nm. Infrared analysis clearly shows a strong new band centered at 1800 $cm^{-1}$ which corresponds to an isoimide.

Acetyl chloride and benzoyl chloride were not as efficient and gave less isoimide and more imide.

EXAMPLE 2

The process of Example 1 was repeated except using 2- thiophenenecarbonyl chloride and substantially the same results were obtained. Again, acetyl chloride and benzoyl chloride were not as efficient and similarly gave less isoimide and more imide.

These isoimidized BPOA-PDA polymers have a number of remarkable features. First, they are relatively stable towards isomerization to form the imide and last for days in air at room temperature when placed in a desiccator and do not show any serious degradation. Also, they are relatively stable toward water and alcohols. No reaction at room temperature was observed when they were exposed for about five minutes to neutral pH water or alcohols.

It should be noted, however, that not all polyisoimides will be as stable to alcohol as BPDA-PDA isoimides. It is known in this regard, that isoimidized PMDA-ODA reacts with alcohols more readily.

EXAMPLE 3

The reaction between thermally cured BPDA-PDA polyimide and allylamine is slow at room temperature. In fact, an approximate 600 Å film shows no discernable reaction after 30 minutes in neat allylamine. When the isoimidized polymer of Example 1 is immersed in neat allylamine at room temperature, the bright yellow color is bleached within a few seconds. IR analysis shows that the isoimide peak at 1800 $cm^{-1}$ is gone with the formation of the amine amide.

EXAMPLE 4

The method of Example 3 was repeated, however, the isoimidized polyimide was reacted with ethylenediamine and an amino group of the amine reacted with the isoimide group of the polymer to form an amine amide. When ethylenediamine is used as a reactant between the surfaces of two isoimidized films, it will facilitate bonding of the films by acting as a cross-linking agent. Other primary amines, including some aromatic amines, and not known diamines can also be employed to react with the isoimidized polyimide.

Further in this regard, ethylene diamine (or an equivalent diamine) can be reacted with the isoimidized surface of a polyimide to form an amine amide as described in Example 4, after which another isoimidized polyimide such as the isoimidized surface of a polyimide can be contacted with the amine amide groups which will react (i.e. cross-link) at relatively low temperatures with the other isoimidized polyimide. Low temperature bonding, especially of isoimidized polyimide films is thus achieved.

EXAMPLE 5

The method of Example 3 was repeated, however, 4-(amino-methyl)pyridine was reacted with the isoimidized polyimide and the product obtained reacted with a rhenium photosensitizer complex $Re^I(bpy)(CO)_3tf$ in DME at 55° C. to obtain the following compound:

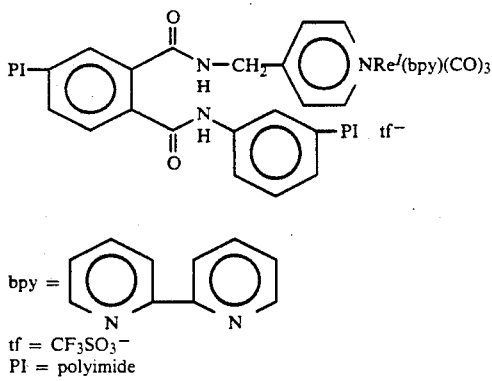

tf = CF$_3$SO$_3^-$
PI = polyimide

The above compound is repeated over the surface of a polyimide that has been isoimidized as described herein and that part of the compound designated "PI" in the above formula is intended to indicate that the novel photosensitive compound is obtained as a result of conducting the aforesaid reaction on the surface of an isoimidized polyimide.

EXAMPLE 7

Films of polyamic acid (Du Pont Pyralin) are spun or cast onto silicon wafers. The films are then imidized using a standard curing cycle. the wafers are immersed in an aqueous NaOH solution (10.3 g NaOH/1 L H$_2$O for 60 minutes), washed with water and next immersed into an aqueous acetic acid (or hydrochloric acid) bath (50 mL CH$_3$CO$_2$H/1 L H$_2$O for 60 minutes). Analysis of the modified surface by X-ray photoelectron spectroscopy (XPS)showed the desired modification had occurre.

The polyimide thus obtained having surface carboxyl groups was reacted with triethylamine to form an amine salt of the carboxyl group. This reaction was carried out in neat triethylamine at room temperature for 15 minutes. The film was then reacted with a mixture of ethylchlorofomate, ethanol and additional triethylamine (ratio of 48/48/4 by volume) at room temperature for 1-2 hours to form an ethyl ester of the carboxyl group on the surface of the film.

XPS data was obtained for the esterified surface as follows:

| | XPS DATA FOR ESTERIFIED SURFACE | | | | | | |
|---|---|---|---|---|---|---|---|
| | C1s | | | | O1s | | N1s |
| | 285.0 | 286.1 | 288.1 | 289.3 | 532.1 | 533.8 | 400.4 |
| | | | Reference spectra | | | | |
| Ester | 38.5 | 46.5 | 7.6 | 7.6 | 57.1 | 42.9 | 100.0 |
| calculated | 53 | 32 | 8 | 7 | 53 | 47 | 100 |
| experimental | | | 288.9 | | 532.4 | | 400.9 |
| Imide | 36.4 | 45.4 | 18.2 | | 80.0 | 20.0 | 100.0 |
| calculated | 43 | 43 | 14 | | 75 | 25 | 100 |
| experimental | | | | | | | |
| | | | Esterified Surface | | | | |
| experimental | 285.0 | 286.0 | 288.5 | 289.3 | 532.0 | 533.7 | 400.5  402.1 |
| | 47 | 35 | 8 | 5 | 49 | 51 | 89  11 |

EXAMPLE 6

Films of BPDA-PDA were prepared on glass substrates by spin coating the poly(amic acid) precursor and curing at 400° C. The film thickness was about 5 μm. These films were hydrolyzed in 1M KOH at 55° C. for 1 hr and treated with 0.1M H$_2$SO$_4$ for 5 min to generate a thin layer of polyamic acid. this surface region was converted to polyisoimide using trifluoroacetic anhydride, nicotinylchloride, or 2-thiophenecarbornyl chloride as described previously.

Once isomidized, the polymer was reacted with a 10% solution of 4-(aminomethyl) pyridine for 15 min. The pyridine efficiently coordinates metal ions. The modified polymer was exposed to 5 mM PdCl$_2$ in methanol for 5 minutes to coordinate Pd(II) to the pyridine sites. This was followed by a methanol rinse and chemical reduction of Pd(II) to Pd(0) using 2M dimethylamineborane (DMAB) in water at room temperature for 1 minute. More Pd(0) can be incorporated by repeating the PdCl$_2$ and DMAB steps Pd(0) is a catalyst for electroless metallization. Electroless copper can be deposited from a standard formaldehyde-based bath onto these seeded films.

Other coordinating agents can also be used. 2-Thiophene methylamine and 1-(3-aminopropyl)imidizole also react with the isoimide and will coordinate Pd(II) as does the 4-(aminomethyl)pyridine.

In addition to allylamine reacted according to Example 4, aminophenyl acetylene or aminostyrene may be reacted with the isoimide in the same way as Example 4. The reaction product can in turn be reacted with a conductive polymer in solution such as a poly(acetylene) or can be used as cross-linking sites to bond two polyimide surfaces thus treated to one another using a free radical catalyst. Additionally, the unsaturated sites provided by these reactants can also be used to complex metal catalysts used in electroless deposition processes such as colloidal palladium catalysts which are well known in the art. These unsaturated sites are also employed to improve the adhesion of metal to the polymer either by a metal on polymer or polymer on metal process. The metals in this regard are those typically employed in electonic packaging structures and may be either copper, gold, nickel, chromium, alloys thereof or the art known equivalents thereof.

The isoimide thus formed can also be reacted with an aminosilane to provide a RIE barrier. The aminosilane, upon reacting with the isoimide group will form an amido silane on the surface of the polyimide which when exposed to an oxygen plasma will be converted into such silicon dioxide sites which provide the RIE barrier.

The various amino silanes that may be employed in this regard include the following:
trimethoxyaminosilane
N-trimethylsilyldiethylamine
N-trimehtylsilylimidazole

[3-(2-aminoethyl)aminopropyl]trimethoxysilane
cyanoethyltrimethoxysilane
aminopropyltrimethoxysilane
(4-aminopropy)triethoxysilane
[-(β-aminoethylamino)-propyl trimethoxy silane]
t-butyldimethylsilylimidazole The amino silanes may also be employed to promote the adhesion of various metals to the surface of the polymer such as those metals (and alloys) used in electonic packaging structures as noted herein.

Although the invention has been described by reference to some embodiments, it is not intended that the novel process or the products obtained by such process be limited thereby but that modifications are intended to be included as falling within the broad spirit and scope of the foregoing disclosure and the following claims.

Having thus described our invention, what we claim as new, and desire to secure by Letters Patent is:

1. A process for improving the reactivity of a polyamic acid with a nucleophile comprising reacting said polyamic acid with an isoimidizing agent to form a polyisoimide and reacting said polyisoimide with a nucleophile.

2. The process of claim 1 where said polyamic acid is obtained by hydrolyzing a polyimide to said polyamic acid.

3. The process of claim 2 where said hydrolyzing is effected on the surface of a polyimide.

4. The process of claim 3 where said polyimide is based on the condensation of a cyclic tetracarboxylic acid or the anhydride of said tetracarboxylic acid and a cyclic diamine.

5. The process of claim 4 where said nucleophile comprises an organic hydroxy compound.

6. The process of claim 4 where said nucleophile comprises an organic amine.

7. A process of forming an isoimide of an amic acid comprising contacting an amic acid compound with and isoimidizing agent, wherein said isoimidizing agent is an acyl halide of a heterocyclic nitrogen compound or an acyl halide of a heterocyclic chalcogen compound to obtain an isoimide.

8. The process of claim 7 comprising subsequently reacting said isoimide with a nucleophile.

9. The process of claim 8 where said nucleophile comprises a primary or secondary organic amine.

10. The process of claim 9 where said organic amine comprises an aliphatic or cyclic monoamine.

11. The process of claim 10 where said organic amine comprises an aliphatic or cyclic polyamine.

12. The process of claim 11 where said organic amine comprises an aliphatic or cyclic diamine.

13. The process of claim 9 where said amine is unsaturated or aromatic.

14. The process of claim 13 wherein said amine reacted with said isoimide is allyl amine; aminostyrene; aminophenylacetylene; ethylenediamine; 2-thiophenemethylamine; 1-(3-aminopropyl)imidizole or 4-(aminomethyl) pyridine to obtain an amide.

15. The process of claim 12 where said amine is an aliphatic diamine having from 2 to about 6 carbon atoms.

16. The method of claim 7 where said acyl halide comprises a saturated or unsaturated heterocyclic compound of the formula:
where $Z^1 = N, O, S, CH_2$;
$Z^2 = N, O, S, CH_2$;
$Z^3 = N$;

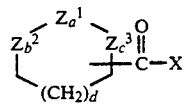

$X$ = halogen;
$a = 0$ or 1;
$b = 0$ or 1;
$c = 0$ or 1;
$d = 0$ or 1;
so that $a+b+c+d$ is at least 3; $Z^1$, $Z^2$, $Z^3$ can be positioned as shown or substituted in any one of the positions in the ring;
$Z^1$, $Z^2$, $Z^3$ can optionally be at least one fused heterocyclic ring or at least one fused carbocyclic ring.

17. The process of claim 16 where X is Cl, Br, I.

18. The process of claim 17 where said imidizing is carried out in the presence of a compound containing a heterocyclic nitrogen group.

19. The process of claim 18 where said compound containing a heterocyclic nitrogen group comprises a saturated or unsaturated heterocyclic compound of the formula:

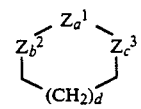

where $Z^1 = N, O, S, CH_2$;
$Z^2 = N, O, S, CH_2$;
$Z^3 = N$;
$a = 0$ or 1;
$b = 0$ or 1;
$c = 0$ or 1;
$d = 0$ or 1;
so that $a+b+c+d$ is at least 3;
$Z^1$, $Z^2$, $Z^3$ can be positioned as shown or substituted in any one of the positions in the ring;
$Z^1$, $Z^2$, $Z^3$ can optionally be at least one fused heterocyclic ring or fused carbocyclic ring.

20. The process of claim 16 where said amic acid is a polyamic acid surface layer formed by the surface hydrolysis of a polyimide.

21. The process of claim 20 where said polyamic acid is a condensation product of a cyclic tetracarboxylic acid or an anhydride of said acid, and a cyclic diamine.

22. The process of claim 21 wherein said isoimidizing agent comprises a 2-nicotinylhalide hydrohalide or a 2-thiophenecarbonyl halide.

23. The process of claim 22 where said isoimide is reacted with a nucleophile.

24. The process of claim 23 where said nucleophile comprises a primary or secondary organic amine.

25. The process of claim 24 where said amine comprises an aliphatic or cyclic monoamine.

26. The process of claim 24 where said amine comprises an aliphatic or cyclic polyamine.

27. The process of claim 26 where said amine comprises an aliphatic or cyclic diamine.

28. The process of claim 24 where said amine is unsaturated or aromatic.

29. The process of claim 24 wherein said amine reacted with said isoimide is allylamine; aminostyrene; aminophenylacetylene; ethylene diamine; 2-thiophene methylamine; 1-(3-aminopropyl)imidizole or 4-(aminomethyl)pyridine to obtain an amide.

30. The process of claim 29 where said amine comprises 4-(aminomethyl)pyridine to obtain an amide and said amide is reacted with Re$^I$(bpy)(CO)$_3$tf to obtain a photosensitive material.

31. The amide of a polyisoimide and 4-(aminomethyl) pyridine.

32. The photosensitive material of the complex of Re$^I$(bpy)(CO)$_3$tf and the amide of claim 31.

33. The amide of allylamine and a polyisoimide.

34. The amide of aminostyrene and a polyisoimide.

35. The amide of aminophenylacetylene and a polyisoimide.

36. The amide of 2-thiophene methylamine and a polyisoimide.

37. The amide of ethylene diamine and a polyisoimide.

38. The amide of 1-(3-aminopropyl)imidizole and a polyisoimide.

39. The amide of 4-(aminomethyl)pyridine and a polyisoimide.

40. A process for the coordination of a metal ion to a polyimide comprising, converting said polyimide to a polyisoimide, reacting said polyisoimide with a heterocyclic nitrogen or a heterocyclic chalogen compound having reactive amino or hydroxyl groups thereon to obtain an amide or an ester adduct of said polyisoimide, and combining said adduct with a metal ion to form a coordination compound of said adduct.

41. The method of claim 40 where said metal ion is a Group VIII metal ion.

42. The method of claim 41 where said Group VIII metal ion is based on a noble metal.

43. The process claim 42 where said metal ion is a palladium ion.

44. The process of claim 40 where said metal ion is reduced to a zero valent metal.

45. The process of claim 41 where said metal ion is reduced to a zero valent metal.

46. The process of claim 42 where said metal ion is reduced to a zero valent metal.

47. The process of claim 43 where said metal ion is reduced to a zero valent metal.

48. The process of claim 44 where said zero valent metal is contacted with an electroless metal coating composition.

49. The process of claim 45 where said zero valent metal is contacted with an electroless metal coating composition.

50. The process of claim 46 where said zero valent metal is contacted with an electroless metal coating composition.

51. The process of claim 47 where said zero valent metal is contacted with an electroless metal coating composition.

52. The process of claim 51 where said polyisoimide is reacted 2-thiophene methylamine.

53. The process of claim 51 where said polyisoimide is reacted with 1-(3-aminopropyl)imidizole.

54. The process of claim 51 where said polyisoimide is reacted with 4-(aminomethyl) pyridine.

55. A process comprising (a) hydrolyzing the surface of an imide containing polymer to form free carboxyl groups thereon, said hydrolyzing being conducted to leave sufficient polyimide groups in said polymer so that said polymer substantially retains its structural integrity after said hydrolysis: (b) and reacting said carboxyl groups by forming an amine salt of said carboxyl groups followed by reacting said salt with an alkyl haloformate and an alcohol.

56. A process of reacting a first isoimide with a second isoimide comprising forming a amino amide of said first isoimide and a polyamine and reacting said amino amide with said second isoimide.

57. The process of claim 56 where said first isoimide is a polyisoimide and said second imide is a polyisoimide.

58. The process of claim 57 where said polyamine is an aliphatic or cyclic diamine.

59. The method of claim 56 comprising reacting a first polyimide having an isoimidized surface with a second polyimide having an isoimidized surface by forming an amino amide with the isoimidized surface of said first polyimide and a polyamine and reacting said amino amide with the isoimidized surface of said second polyimide.

60. The method of claim 59 where said polyamine is an aliphatic or cyclic diamine.

61. The method of claim 60 where said diamine is ethylene diamine.

* * * * *